US011693233B2

(12) United States Patent
Baran

(10) Patent No.: US 11,693,233 B2
(45) Date of Patent: Jul. 4, 2023

(54) MICROELECTROMECHANICAL SYSTEM (MEMS) SCANNER HAVING ACTUATOR PAIRS CANTILEVERED ADJACENT TO OPPOSITE SIDES OF A SCANNING MIRROR

(71) Applicant: MICROSOFT TECHNOLOGY LICENSING, LLC, Redmond, WA (US)

(72) Inventor: Utku Baran, Mercer Island, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 200 days.

(21) Appl. No.: 16/996,805

(22) Filed: Aug. 18, 2020

(65) Prior Publication Data

US 2021/0396995 A1 Dec. 23, 2021

Related U.S. Application Data

(60) Provisional application No. 63/041,710, filed on Jun. 19, 2020.

(51) Int. Cl.
*G02B 26/10* (2006.01)
*G02B 26/08* (2006.01)

(52) U.S. Cl.
CPC ....... *G02B 26/101* (2013.01); *G02B 26/0858* (2013.01)

(58) Field of Classification Search
CPC ........ B81B 2201/032; B81B 2201/042; B81B 2203/0181; B81B 3/0043; B81B 3/0083;
(Continued)

(56) References Cited

U.S. PATENT DOCUMENTS

2007/0268950 A1 11/2007 Spinelli et al.
2014/0340726 A1 11/2014 Gu-stoppel et al.
(Continued)

FOREIGN PATENT DOCUMENTS

EP 3715317 A1 9/2020

OTHER PUBLICATIONS

Lee, et al., "LIDAR system using indirect time of flight method and MEMS scanner for distance measurement", In Journal of International Conference on Optical MEMS and Nanophotonics, Jul. 31, 2016, 2 Pages.
(Continued)

*Primary Examiner* — Richard J Hong
(74) *Attorney, Agent, or Firm* — Newport IP, LLC; Jacob P. Rohwer

(57) ABSTRACT

A microelectromechanical systems (MEMS) scanner having actuator pairs adjacent to sides of a scanning mirror. Actuator pairs include individual actuators that are physically located adjacent to opposite sides of the scanning mirror and that, upon activation, induce angular rotation into the scanning mirror. Torsional beam flexures suspend the scanning mirror from a frame structure and facilitate rotation of the scanning mirror about a rotational axis. During operation of the MEMS scanner, a drive signal may be applied to the actuator pair to cause each individual actuator, of the actuator pair, to deform in unison, thereby generating some degree of tip deflection. Since the torsional beam flexures are connected to the tips of the actuators via the lever arms, this tip deflection serves as actuator stroke that induces torsional deformation into the torsional beam flexure—thereby causing rotation of the scanning mirror about the rotational axis.

18 Claims, 10 Drawing Sheets

(58) Field of Classification Search
CPC .. G02B 26/0858; G02B 26/101; G02B 26/10;
G02B 26/0833; G03B 21/28; G01L 5/00;
H01L 41/0946
See application file for complete search history.

(56) References Cited

U.S. PATENT DOCUMENTS

| | | | | |
|---|---|---|---|---|
| 2015/0204650 A1* | 7/2015 | Erlich | ................ | G02B 26/0833 |
| | | | | 324/686 |
| 2015/0241196 A1* | 8/2015 | Gerson | .............. | G02B 26/0833 |
| | | | | 73/788 |
| 2015/0323782 A1* | 11/2015 | Goren | .................... | G02B 26/10 |
| | | | | 359/198.1 |
| 2017/0153443 A1* | 6/2017 | Carminati | ............ | G02B 26/101 |
| 2017/0285332 A1* | 10/2017 | Merli | ........................ | G01L 5/00 |
| 2018/0180871 A1* | 6/2018 | Costantini | ............. | B81B 3/0083 |
| 2020/0192199 A1* | 6/2020 | Boni | ....................... | G03B 21/28 |
| 2020/0310110 A1* | 10/2020 | Carminati | ........... | H01L 41/0946 |

OTHER PUBLICATIONS

Holmstrom, et al., "MEMS laser scanners: a review", In Journal of Microelectromechanical Systems, vol. 23, Issue 2, Apr. 2014, pp. 259-275.

"International Search Report and Written Opinion Issued in PCT Application No. PCT/US21/029027312", dated Jul. 27, 2021, 16 Pages.

* cited by examiner

MICROELECTROMECHANICAL SYSTEM (MEMS) SCANNER HAVING ACTUATOR PAIRS CANTILEVERED ADJACENT TO OPPOSITE SIDES OF A SCANNING MIRROR

PRIORITY APPLICATION

This application claims the benefit of and priority to U.S. Provisional Application No. 63/041,710, filed Jun. 19, 2020, entitled "Microelectromechanical System (Mems) Scanner Having Actuator Pairs Cantilevered Adjacent To Opposite Sides Of A Scanning Mirror," the entire contents of which are incorporated herein by reference.

BACKGROUND

Microelectromechanical systems (MEMS) scanning devices modulate a position of a scanning mirror by applying a drive signal to actuators that are mechanically coupled to the scanning mirror. One important design goal for MEMS scanning devices is reducing the form factor to assist with miniaturization of the products into which the MEMS scanning devices are installed. For example, MEMS scanning devices are commonly used in Head-Mounted-Display (HMD) device applications and miniaturizing HMD device componentry is a major goal within this industry. Reducing the overall form factor (e.g., size) of MEMS scanning devices clearly furthers this goal. Another important design goal for MEMS scanning devices is maximizing the amount of angular rotation that is achievable at the scanning mirror via application of the drive signal to the actuators. Generally, the amount of angular rotation that is achievable within the scanning mirror is directly related to the amount of actuatable stroke that is achievable within the actuators.

Unfortunately, these two design goals tend to conflict with one another since larger actuators generally produce more actuatable stroke than do smaller actuators. To illustrate this point, consider that the amount of actuatable stroke achievable in an actuator is tends to increase in relation to both increased actuator length a longitudinal direction and increased film-area (e.g., on which a piezoelectric material is deposited). For this reason, conventional MEMS scanning devices often include thin-film piezoelectric actuators that extend far beyond two opposing ends of a scanning mirror that are rotatably coupled to a frame structure. While such conventional designs may produce sufficient actuator stroke and, therefore, angular rotation of the scanning mirror, these designs leave much wanting with respect to the design goal of reducing the overall form factor (e.g., size) of the MEMS scanning devices.

It is with respect to these and other considerations that the disclosure made herein is presented.

SUMMARY

Technologies described herein provide a microelectromechanical systems (MEMS) scanning device (referred to hereinafter as "MEMS scanner") that includes pairs of actuators that are cantilevered adjacent to sides of a scanning mirror. Generally described, various MEMS scanner embodiments disclosed herein utilize pairs of actuators that extend along sides of a scanning mirror and that may be activated to apply actuator stroke to torsional beam flexures that are coupled to ends of the scanning mirror. The torsional beam flexures suspend the scanning mirror from a frame structure and facilitate rotation of the scanning mirror about a rotational axis. For example, each torsional beam flexure may include one or more lever arms extending to a tip of a corresponding actuator of an actuator pair. During operation of the MEMS scanner, a drive signal may be applied to the actuator pair to cause each individual actuator, of the actuator pair, to deform in unison, thereby generating some degree of tip deflection. Since the torsional beam flexures are connected to the tips of the actuators via the lever arms, this tip deflection serves as actuator stroke that induces torsional deformation into the torsional beam flexure—thereby causing rotation of the scanning mirror about the rotational axis. As described in detail below, the pairs of actuators being cantilevered adjacent to the sides of the scanning mirror yields a marked reduction in the form factor of the MEMS scanner without lessening the angular rotation that can be induced into the scanning mirror via application of the drive signals. Thus, the techniques described herein provide benefits over conventions MEMS scanners which include thin-film piezoelectric actuators that extend far beyond the ends from which a scanning mirror is suspended.

To illustrate this point, consider that the amount of angular rotation that can be induced into the scanning mirror increases as the amount of actuatable stroke that can be induced at the actuator tips increases. Further consider that the amount of actuatable stroke that is achievable at the actuator tips tends to increase in relation to both increased actuator length (e.g., the distance which the actuator plate is cantilevered from a frame structure) and increased film-area (e.g., the total surface of the actuator onto which a piezoelectric material is deposited). Thus, regions of a MEMS scanner which are not utilized to increase actuator length or film-area do not serve to increase actuatable stroke and, in turn, achievable angular rotation. Some existing MEMS scanning devices are ripe with regions of this type of so-called "dead-space" (e.g., regions which are not utilized to increase actuator length or film-area) adjacent to sides of a scanning mirror. In contrast to existing MEMS scanning devices, various MEMS scanner embodiments described herein include pairs of actuators that are located adjacent to one or both sides of a scanning mirror so that these regions are efficiently utilized to contribute to achievable angular rotation. In this way, the overall form factor of the MEMS scanner can be significantly reduced without negatively impacting functionality in terms of achievable angular rotation of the scanning mirror.

In an example embodiment, the MEMS scanner includes a scanning mirror that is suspended from a frame structure by way of two torsional beam flexures that are mechanically coupled to opposite ends of the scanning mirror. The MEMS scanner further includes two pairs of actuators (e.g., making up four individual actuators) that are cantilevered from the frame structure and that are positioned adjacent to opposite sides of the scanning mirror. The actuators may be coupled to the scanning mirror directly or indirectly by way of the torsional beam flexures. For example, each of the torsional beam flexures may include two lever arms that extend in opposite directions from one another and that are each mechanically coupled to a corresponding actuator tip. That is, each torsional beam flexure may be coupled to two actuator tips that are on opposite sides of the scanning mirror and that correspond to different actuator pairs. In some embodiments, both of the actuators in the torsional beam flexures may be mechanically coupled to the frame structure. Furthermore, the frame structure may in some embodiments fully encompass (e.g., wrap around) the scanning mirror, the torsional beam flexures, and the pairs of actuators. In this way, the outer perimeter of the frame structure may define an overall form factor (e.g. in terms of cross-sectional size/area) of the MEMS scanner.

The individual pairs of actuators may be activated, via drive signals provided by a controller, to exert forces against lever arms affixed to each of the first of the two torsional beam flexures. These forces result in moments being applied to each of the torsional beam flexures which in turn causes some degree of torsional deformation to each of these torsional beam flexures. Since the scanning mirror is suspended from the frame structure via the torsional beam flexure, activation of the actuator pairs results in some degree of angular rotation of the scanning mirror (about the rotational axis and in relation to the frame structure) that is commensurate with the degree of torsional deformation to the torsional beam flexure. As described in detail herein, an object of the example MEMS scanner(s) disclosed herein is to maximize the efficiency with which various functional components are arranged so as to miniaturize the overall form factor of the MEMS scanner without hindering an achievable amount of angular rotation that can be induced into the scanning mirror.

To accomplish this objective, a first actuator pair may be positioned adjacent to a first side of the scanning mirror. This first actuator pair may include: (i) a first actuator that extends from the frame structure and is mechanically coupled to a first torsional beam flexure from which a first side of the scanning mirror is suspended, and (ii) a second actuator that extends from the frame structure and is mechanically coupled to a second torsional beam flexure from which a second side of the scanning mirror is suspended. Thus, each of the first actuator and the second actuator within this first actuator pair are adjacent to the same side of the scanning mirror. Similarly, a second actuator pair may be positioned adjacent to a second side of the scanning mirror (e.g., that is opposite the first side of the scanning mirror). This second actuator pair may include: (i) a third actuator that extends from the frame structure and is mechanically coupled to the first torsional beam flexure from which the first side of the scanning mirror is suspended, and (ii) a fourth actuator that extends from the frame structure and is mechanically coupled to the second torsional beam flexure from which the second side of the scanning mirror is suspended. Thus, each of the third actuator and the fourth actuator within this second actuator pair are adjacent to the same side of the scanning mirror.

In this way, the region or area of the MEMS scanner that is within the outer perimeter of the frame structure and is located adjacent to either side of the scanning mirror is efficiently utilized so as to contribute to increasing the actuator length, or to increase the total thin-film area, or both. As compared to existing MEMS scanners in which actuators extend to the ends of the scanning mirror from portions of a frame structure that are well beyond the ends of the scanning mirror, the MEMS scanners described herein are significantly shorter in terms of length while being substantially similar in terms of width. This results in a markedly improved form factor (e.g., reduced length and/or total area) while still achieving sufficient responsiveness and actuatable angular rotation of the scanning mirrors.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

DETAILED DESCRIPTION

This Detailed Description describes a microelectromechanical systems (MEMS) scanner comprising actuators that are positioned adjacent to sides of a scanning mirror. Generally described, various embodiments of the MEMS scanner disclosed herein utilize pairs of actuators that extend along one or both sides of a scanning mirror to induce angular rotation into the scanning mirror (e.g., via application of large amounts of actuator stroke to torsional beam flexures that are coupled to ends of the scanning mirror). During operation of the MEMS scanner, a drive signal is applied to the actuator pairs to cause each individual actuator, of the actuator pairs, to deform in unison to generate some degree of tip deflection. In some embodiments, the torsional beam flexures are mechanically coupled to the tips of the actuators via the lever arms. In this way, tip deflection at the actuators serves as actuator stroke that induces torsional deformation into the torsional beam flexure which in turn causes rotation of the scanning mirror about the rotational axis. Compared to existing MEMS scanning devices (e.g., which include actuators that extend far beyond the ends from which a scanning mirror is suspended), the pairs of actuators being cantilevered adjacent to the sides of the scanning mirror furthers the objective of miniaturizing the MEMS scanner without hinder the objective of achieving sufficient actuatable angular rotation of the scanning mirror.

To illustrate this point, consider that the amount of angular rotation that can be induced into the scanning mirror tends to increase as the amount of actuatable stroke that can be induced at the actuator tips increases. Further consider that the amount of actuatable stroke that is achievable at the actuator tips tends to increase in relation to both increased actuator length (e.g., the distance which the actuator plate is cantilevered from a frame structure) and increased film-area (e.g., the total surface of the actuator onto which a piezoelectric material is deposited). Thus, it can be appreciated that regions of a MEMS scanner which are not utilized to increase actuator length or film-area do not contribute to increasing actuatable stroke and, in turn, achievable angular rotation. Some existing MEMS scanning devices are ripe with regions of this type of "dead-space" which are not utilized to increase actuator length or film-area.

Figure 1:
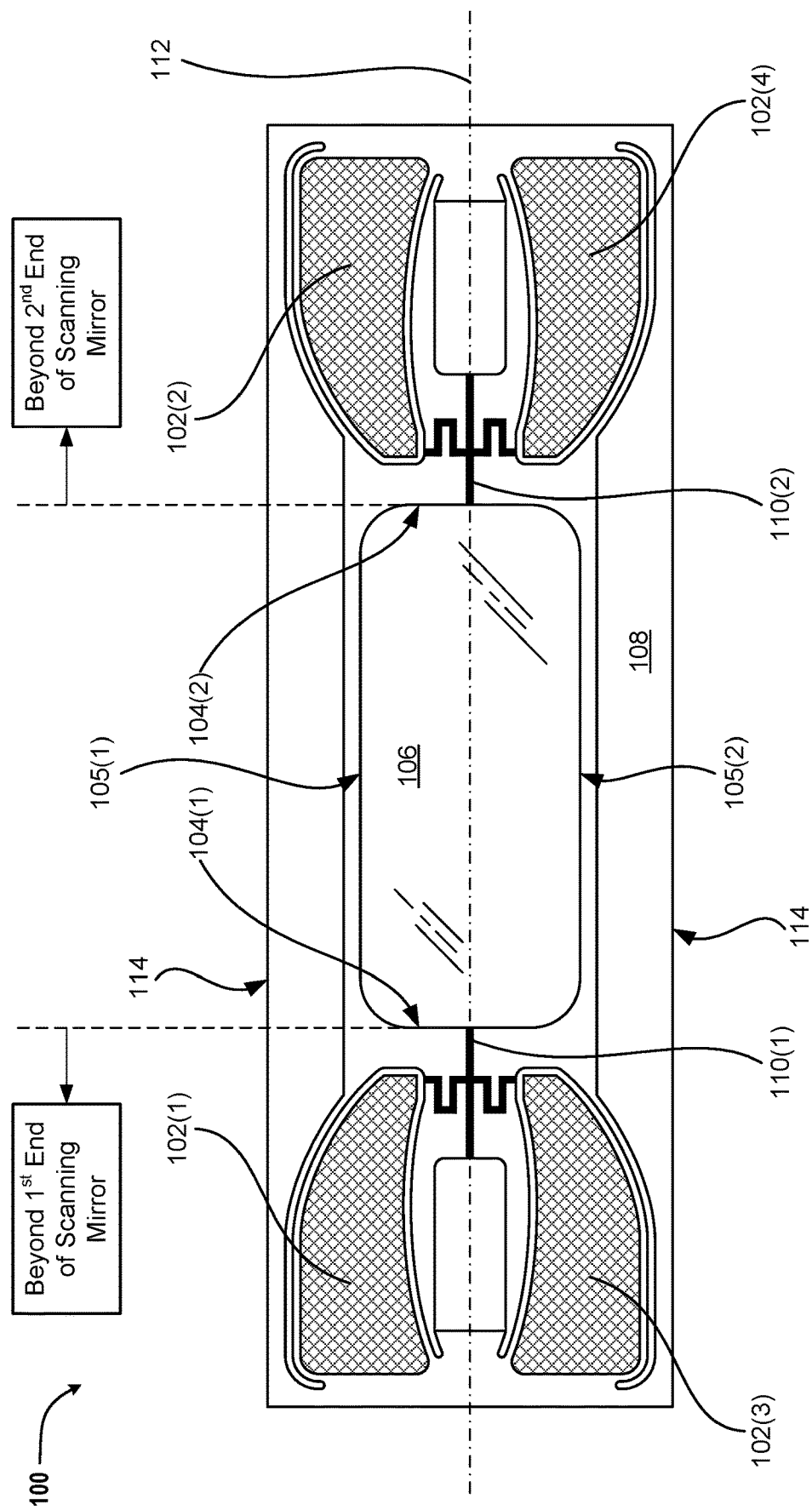
FIG. 1 illustrates an exemplary prior art MEMS scanner that includes actuators that positioned entirely beyond the ends of a scanning mirror.

FIG. 1 illustrates an exemplary prior art MEMS scanner 100 that includes actuators 102 that positioned entirely beyond the ends 104 of a scanning mirror 106. The scanning mirror 106 is suspended from a frame structure 108 by way of a first torsional beam flexure 110(1) and a second torsional beam flexure 110(2). As illustrated in FIG. 1, the first torsional beam flexure 110(1) is mechanically coupled to both of a first actuator 110(1) and a third actuator 110(3) by way of lever arms that extend transverse in relation to a rotational axis 112. Similarly, the second torsional beam flexure 110(2) is mechanically coupled to both of a second actuator 110(2) and a fourth actuator 110(4), also by way of lever arms extending transverse in relation to the rotational axis 112. For illustrative purposes, the torsional beam flexures 110 (including the lever arms thereof) as illustrated in solid black to adequately demark transitions between the torsional beam flexures 110 and the other system components (e.g., the scanning mirror 106, the frame 108, and the actuators 102). It will be appreciated by one skilled in the art of MEMS actuator design that the torsional beam flexures 110 may be coupled to the scanning mirror 106, the actuators 102, and/or the frame 108 by via a layer of silicon film that is common to and continuous between the torsional beam flexures 110 and the other system components. Furthermore, the actuators 102 may each include a thin (e.g., three micron "3 μm") layer of lead zirconate titanate (PZT)—a material that shows a marked piezoelectric effect. In various FIGURES of the present disclosure, a thin-film layer of PZT is graphically illustrated as a diamond hatched pattern.

As illustrated, the MEMS scanner 100 includes four actuators labeled 102(1) through 102(4) and each of these four actuators are located entirely within the regions labeled as being beyond the first end 104(1) or second end 104(2) of the scanning mirror 106. Thus, the regions of the MEMS scanner 100 that are within the outer perimeter 114 of the frame structure 108 and that are adjacent to the sides 105 of the scanning mirror 106 do not contribute to increasing either of actuator length or film-area. Thus, these regions represent a "dead-space" as described above. With respect to the overall form factor of the MEMS scanner 100, the length to width ratio is roughly in the range of 2-to-1. As a specific but non-limiting example, the length of the MEMS scanner 100 may be 11.8 mm whereas the width of the MEMS scanner 100 may be 5.3 mm—resulting in a total area of 62.54 mm$^2$.

Figure 2:
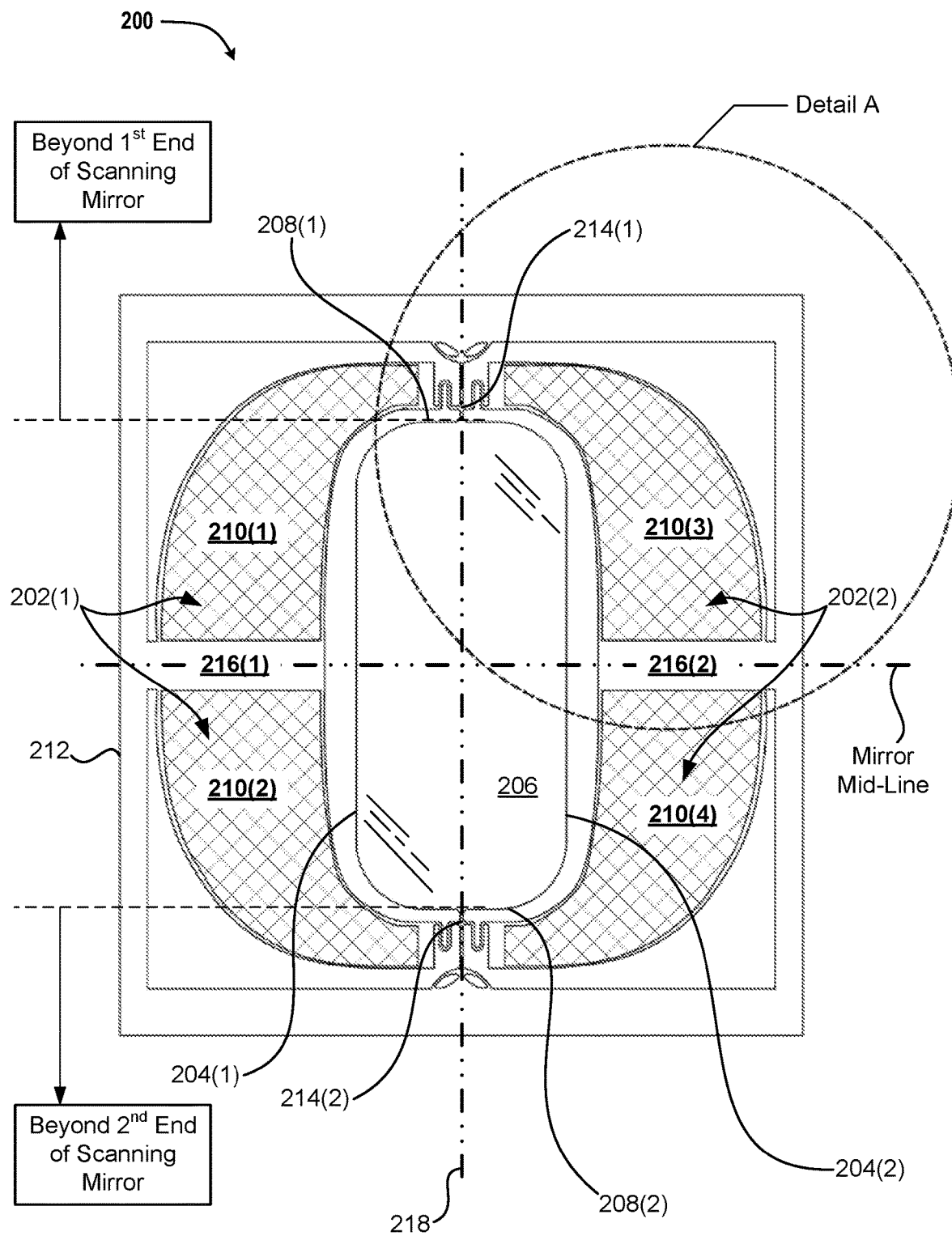
FIG. 2 illustrates an exemplary MEMS scanner that includes two actuator pairs that are cantilevered adjacent to opposite sides of a scanning mirror.

Turning now to FIG. 2, illustrated is an exemplary MEMS scanner 200 that includes two actuator pairs 202 that are cantilevered adjacent to opposite sides 204 of a scanning mirror 206. Specifically, the exemplary MEMS scanner 200 includes a first actuator pair 202(1) that is disposed adjacent to a first side 204(1) of the scanning mirror 206 and a second actuator pair 202(2) that is disposed adjacent to a second side 204(2) of the scanning mirror 206. The first actuator pair includes a first actuator 210(1) that extends from a frame structure 212 to a first torsional beam flexure 214(1) and a second actuator 210(2) that extends from the frame structure 212 to a second torsional beam flexure 214(2). As illustrated, the first actuator 210(1) and the second actuator 210(2) each protrude from a first actuator support 216(1) and extend along the first side 204(1) of the scanning mirror 206 in opposite directions towards the corresponding torsional beam flexures 214. Similarly, the second actuator pair includes a third actuator 210(3) that extends from the frame structure 212 to the first torsional beam flexure 214(1) and a fourth actuator 210(4) that extends from the frame structure 212 to the second torsional beam flexure 214(2). As illustrated, the third actuator 210(3) and the fourth actuator 210(4) each protrude from a second actuator support 216(2) and extend along the second side 204(2) of the scanning mirror 206 in opposite directions towards the corresponding torsional beam flexures 214. Thus, as illustrated, at least some portion of the individual actuators is disposed adjacent to the sides 204 of the scanning mirror 206.

As used herein and for purposes of the claims, descriptions and/or recitations of a component (or a particular portion of a component) being adjacent to a side of a scanning mirror refers to that component or portion thereof not being physically located beyond the ends from which the scanning mirror is mechanically suspended. Thus, it can be appreciated from FIG. 2 that in the exemplary MEMS scanner 200 a majority of the total area of each individual actuator 210 is physically located adjacent to the sides 204 of the scanning mirror 206. The actuators 210 being at least partially located adjacent to the sides 204 of the scanning mirror 206 yields a marked reduction in the form factor of the MEMS scanner 200. For example, with respect to the overall form factor of the MEMS scanner 200, the length to width ratio is roughly in the range of 1-to-1. As a specific but non-limiting example, the length of the MEMS scanner 200 may be 7.6 mm whereas the width of the MEMS scanner 200 may be 7.0 mm—resulting in a total area of 57.76 mm$^2$. Furthermore, the MEMS scanner 200 is capable of inducing angular rotation into the scanning mirror 206 that is comparable in terms of both responsiveness and achievable angular displacement as the "prior art" MEMS scanner 100—with a roughly 8% smaller form factor.

During operation, first drive signals may be provided to the cause the first actuator 210(1) and the second actuator 210(2) to actuate (e.g., change shape) in unison thereby inducing a moment of force upon each of the first torsional beam flexure 214(1) and the second torsional beam flexure 214(2). The moment forces generated by the first and second actuators may be in the same direction (e.g., clockwise or counterclockwise) about the rotational axis 218. Furthermore, second drive signals may be provided to cause the third actuator 210(3) and the fourth actuator 210(4) to actuate in unison to induce an opposite moment of force upon each of the first torsional beam flexure 214(1) and the second torsional beam flexure 214(2). The first and second drive signals may be applied at different moments in time on a periodic basis to cause the scanning mirror 206 to oscillate back and forth about the rotational axis 218.

Figure 3:
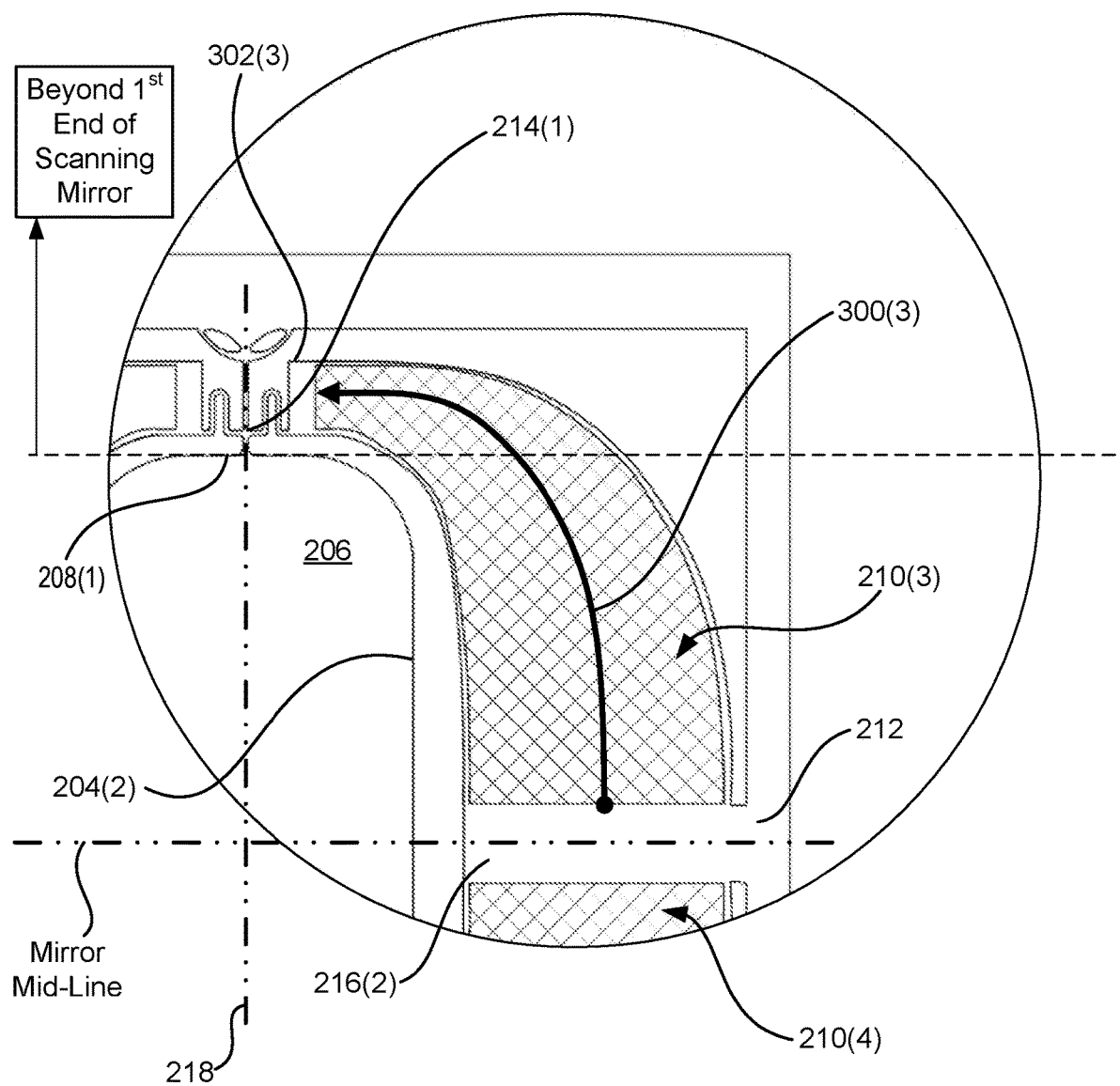
FIG. 3 illustrates addition details of the MEMS scanner in relation to Detail A of FIG. 2.

FIG. 3 illustrates addition details of the MEMS scanner 200 in relation to Detail A of FIG. 2. As shown in FIG. 3, in some embodiments, individual ones of the actuators 210 have an arm midline 300 that extends from the frame structure 212 in a direction that is away from a mirror mid-line and towards an end 208 of the scanning mirror 206. As used herein, the term "mirror mid-line" may be used to refer to a line and/or plane that lies halfway between the first end 208(1) and the second end 208(2) of the scanning mirror 206. For example, if the scanning mirror 206 is 5 mm in length (i.e., the distance between the first end 208(1) and the second end 208(2) is 5 mm) then a mirror mid-line would be located 2.5 mm away from each of the two ends 208. As used herein, the term "arm midline" may be used to refer to a line that extends from a portion of an actuator 210 that is mechanically coupled to the frame structure 212 to the actuator tip 302 and that lies directly along the middle of the actuator 210. For example, as shown in FIG. 3, the third actuator 210(3) has an arm midline 300(3) that extends from the second actuator support 216(2) to the actuator tip 302(3) which is coupled to the first torsional beam flexure 214(4).

As illustrated in FIG. 3, individual actuators 210 of the MEMS scanners described herein may have corresponding arm midlines 300 that begin adjacent to a particular side 204 of a scanning mirror 206 and extend along that particular side 206 toward a particular torsional beam flexure 214 that is beyond an end 208 of the scanning mirror 206. Furthermore, in some embodiments, the arm midline 300 of an individual actuator 210 may have a curvature that changes from extending along a side of the scanning mirror 206 to extending along an end 208 of the scanning mirror 206. For example, as shown in FIG. 3, the arm midline 300(3) of the third actuator 210(3) begins at the second actuator support 216(2) and extends toward the first end 208(1) of the scanning mirror 206. As the arm midline 300(3) becomes gradually farther away from the mirror midline, the arm midline 300(3) also gradually begins to become more directed toward the rotational axis 218 of the scanning mirror 206. Thus, in some embodiments, the arm midlines 300 for the individual actuators 210 may be described as having a contour that corresponds to an outer profile of the scanning mirror 206.

Figure 4:
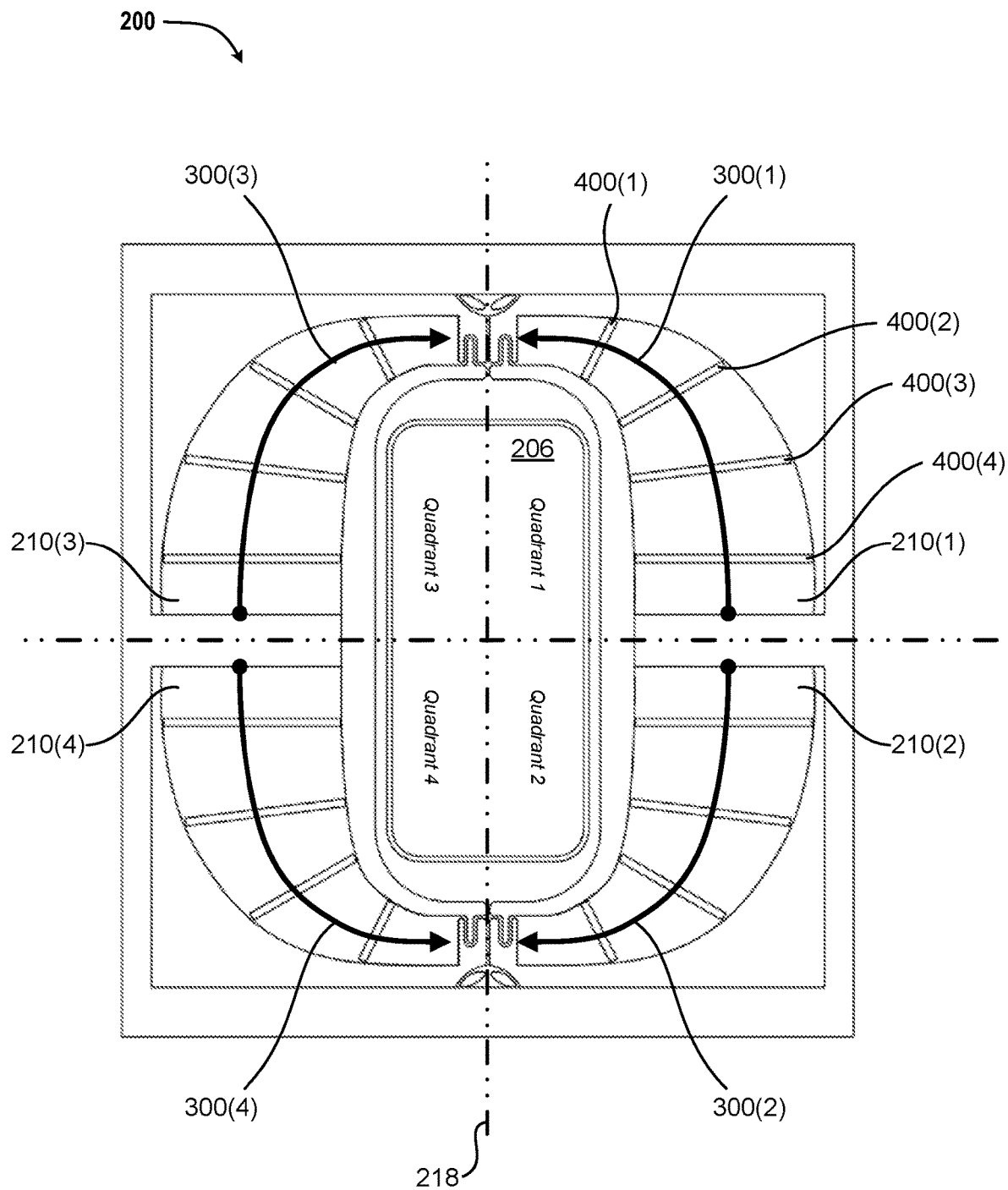
FIG. 4 illustrates a bottom view of the MEMS scanner of FIG. 2 that shows stiffening ribs disposed along bottom surfaces of the actuators.

Turning now to FIG. 4, illustrated is a bottom view of the MEMS scanner 200 that shows a plurality of stiffening ribs 400 disposed along bottom surfaces of the actuators 210. As illustrated, these stiffening ribs 400 may be oriented transversely with respect to arm midlines 300 of the corresponding actuators 210 from which the stiffening ribs 400 protrude. That is, individual ones of the stiffening ribs are oriented in a manner so as to extend across the arm midlines 300. The generally transverse orientation of the stiffening ribs 400 prevents a moment of inertia ("I") of the individual actuators 210 from inadvertently increasing in a particular manner as a result of a drive signal inducing "transverse" curvature into the actuator plate.

To illustrate this point, consider the combined bending modes that occur when activation of a piezoelectric film causes mechanical stress at a surface of an actuator plate. Presuming that the piezoelectric films behaves isotopically such that the mechanical stress includes both a longitudinal component (e.g., a component that is aligned with/parallel to the arm midline 300) and transverse components (e.g., a component that is transverse/orthogonal to the arm midline 300), it will be appreciated that these longitudinal and transverse stress components will induce bending modes associated with longitudinal curvature and transverse curvature, respectively. It will further be appreciated that the mode of bending associated with longitudinal curvature is desirable since the greater the longitudinal curvature the greater the actuatable stroke. That is, the more longitudinal curvature induced into the actuator plate, the farther the tip deflection of the actuator plate. Unfortunately, the amount of longitudinal curvature will decrease as the bending stiffness increases along the arm midline 300 of an actuator. Since the bending stiffness along the arm midline will tend to increase as a result of transverse curvature, reducing or eliminating transverse curvature may serve as an effective means of increasing the amount of achievable longitudinal curvature (and therefore actuatable stroke). For this reason, various embodiments of the MEMS scanners described herein include stiffening ribs 400 that are substantially transversely oriented (e.g., with respect to an arm midline 300) to reduce (or substantially eliminate) transverse curvature by way of increasing the bending stiffness of the actuator plate in directions that are orthogonal to the arm midline. Thus, mitigating this transverse curvature tends to prevent a bending stiffness from increasing along the arm midline (e.g., which defines a longitudinal direction at various sections of the actuators 210) and, therefore, serves as an effective mechanism for increasing the mode of bending associated with longitudinal curvature (e.g., the desired mode of bending/curvature as it corresponds to actuator stroke).

As shown in FIG. 4, the exemplary MEMS scanner 200 includes a plurality of stiffening ribs 400 disposed along and transversely oriented with respect to the arm midline 300 of each individual actuator 210. Furthermore, the individual arm midlines 300 have directions of curvature that wrap around the scanning mirror 206. For example, it can be appreciated from FIG. 4 that each of the four illustrated arm midlines 300 wrap around a corresponding quadrant of the scanning mirror 206.

Figure 5A:
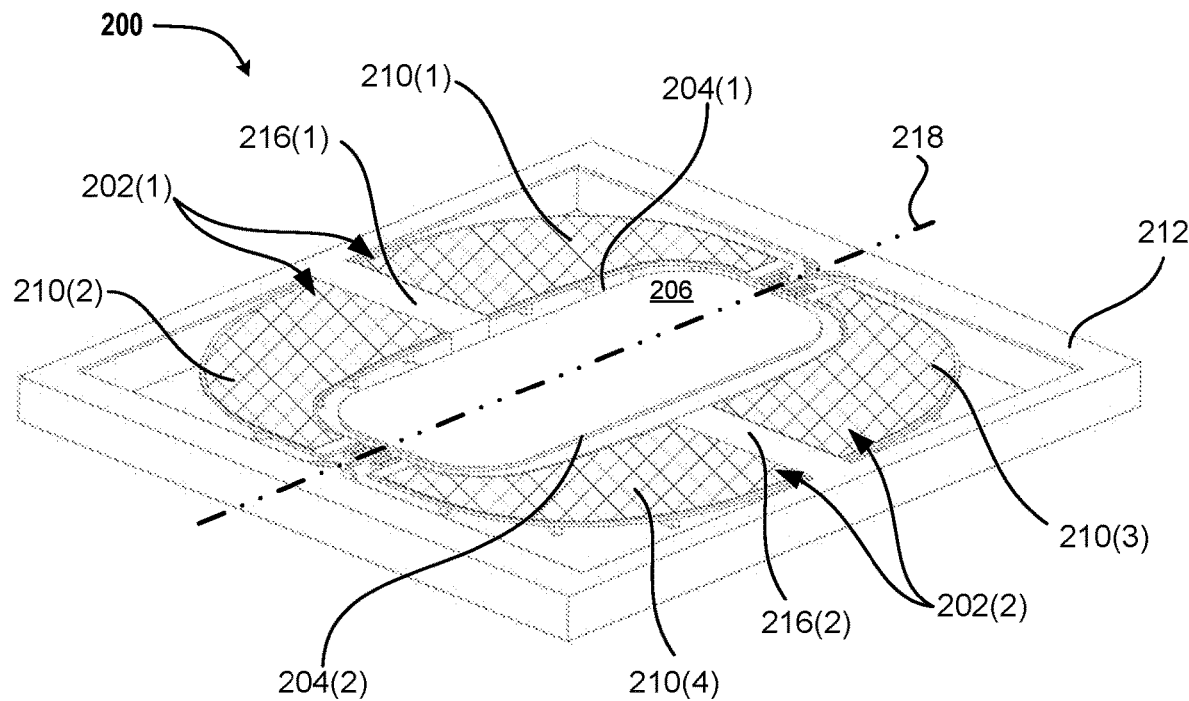
FIG. 5A illustrates an isometric view of the top side of the MEMS scanner of FIG. 2.
Figure 5B:
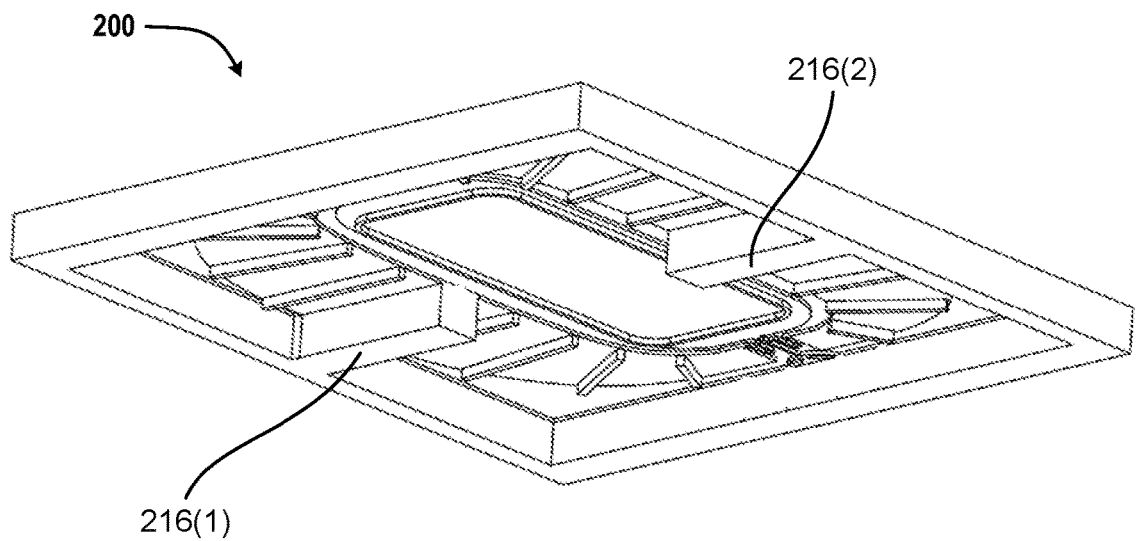
FIG. 5B illustrates an isometric view of the bottom side of the MEMS scanner of FIG. 2.

FIGS. 5A and 5B (collectively referred to herein as FIG. 5) illustrated perspective views of the MEMS scanner 200 from a top viewing angle and bottom viewing angle, respectively. As illustrated, each of the actuator supports 216 are disposed adjacent to respective sides 204 of the scanning mirror 206. In particular, the first actuator support 216(1) protrudes from a first side of the frame structure 212 inwards towards the rotational axis 218 and terminates adjacent to the first side 204(1) of the scanning mirror 206. Similarly, the second actuator support 216(2) protrudes from a second side of the frame structure 212 inwards towards the rotational axis 218 and terminates adjacent to the second side 204(2) of the scanning mirror 206. It can be appreciated that a slight clearance gap exists between the sides 204 of the scanning mirror 206 and the actuator supports 216. As a specific but non-limiting example, a clearance of 0.33 millimeters may exist between the first actuator support 216(1) and the first side 204(1) of the scanning mirror 206. This slight clearance gap allows for the scanning mirror 206 oscillate back and forth about the rotational axis 218 without interfering with the actuator supports 216.

FIG. 5 illustrates that the individual actuators 210 may extend alongside of the scanning mirror 206 and may be protrude or extend from actuator supports 216 that themselves protrude or extend from an outer portion of the frame structure 212. FIG. 5 further illustrates that individual actuators 210 that make up an actuator pair 202 may be mechanically coupled to the same actuator support 216 and may protrude in opposite directions from the same actuator support 216.

Figure 6:
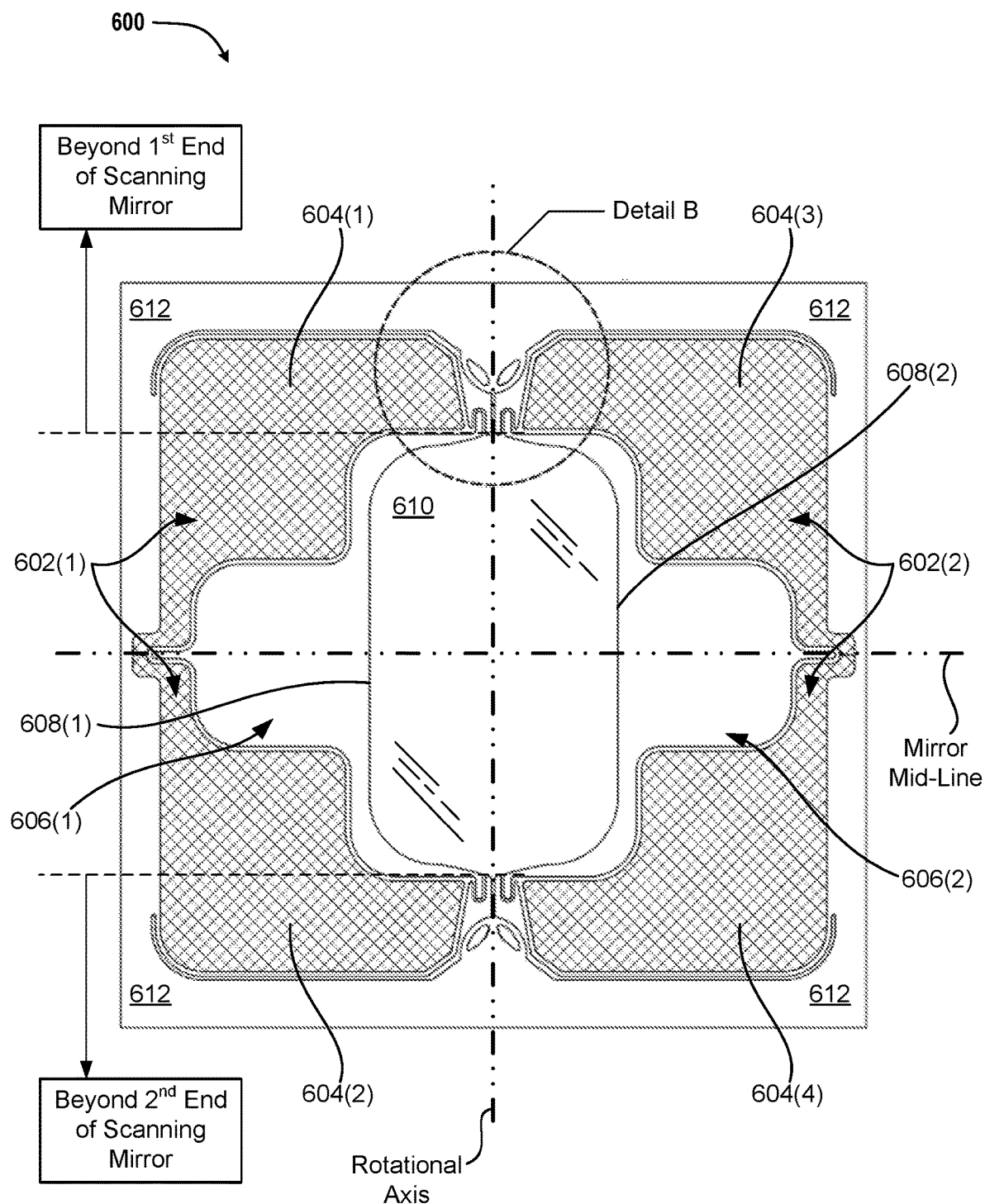
FIG. 6 illustrates an alternate embodiment of an exemplary MEMS scanner that includes actuator pairs that individually form apertures adjacent to opposite sides of a scanning mirror.

Turning now to FIG. 6, illustrated is an alternate embodiment of an exemplary MEMS scanner 600 that includes actuator pairs 602 having two individual actuators 604 which form apertures 606 adjacent to opposite sides 608 of a scanning mirror 610. As illustrated, the exemplary MEMS scanner 600 includes a first actuator pair 602(1) that is disposed adjacent to a first side 608(1) of the scanning mirror 610 and a second actuator pair 602(2) that is disposed adjacent to a second side 608(2) of the scanning mirror 610.

The first actuator pair 602(1) includes a first actuator 604(1) and a second actuator 604(2) that each extend from a portion a frame structure 612 that is at least partially adjacent to the first side 608(1) of the scanning mirror 610. As illustrated, the first actuator 604(1) and the second actuator 604(2) have outer profiles facing the mirror midline that together form a first aperture 606(1) that is aligned over the mirror midline. In some embodiments, the first actuator 604(1) and the second actuator 604(2) are symmetric with one another about the mirror midline so that the first aperture 606(1) is substantially centered on the mirror midline.

Opposite the first actuator pair 602(1), the second actuator pair 602(2) includes a third actuator 604(3) and a fourth actuator 604(4) that each extend from a portion the frame structure 612 that is at least partially adjacent to the second side 608(2) of the scanning mirror 610. Thus, the first actuator 604(1) and third actuator 604(3) are extending towards one another whereas the second actuator 604(2) and the fourth actuator 604(4) are similarly extending towards one another. As illustrated, the third actuator 604(3) and the fourth actuator 604(4) have outer profiles facing the mirror midline that together form a second aperture 606(2) that is aligned over the mirror midline. In some embodiments, the first and second actuators are symmetric about the mirror midline so that the second aperture 606(2) is substantially centered on the mirror midline.

Figure 7:
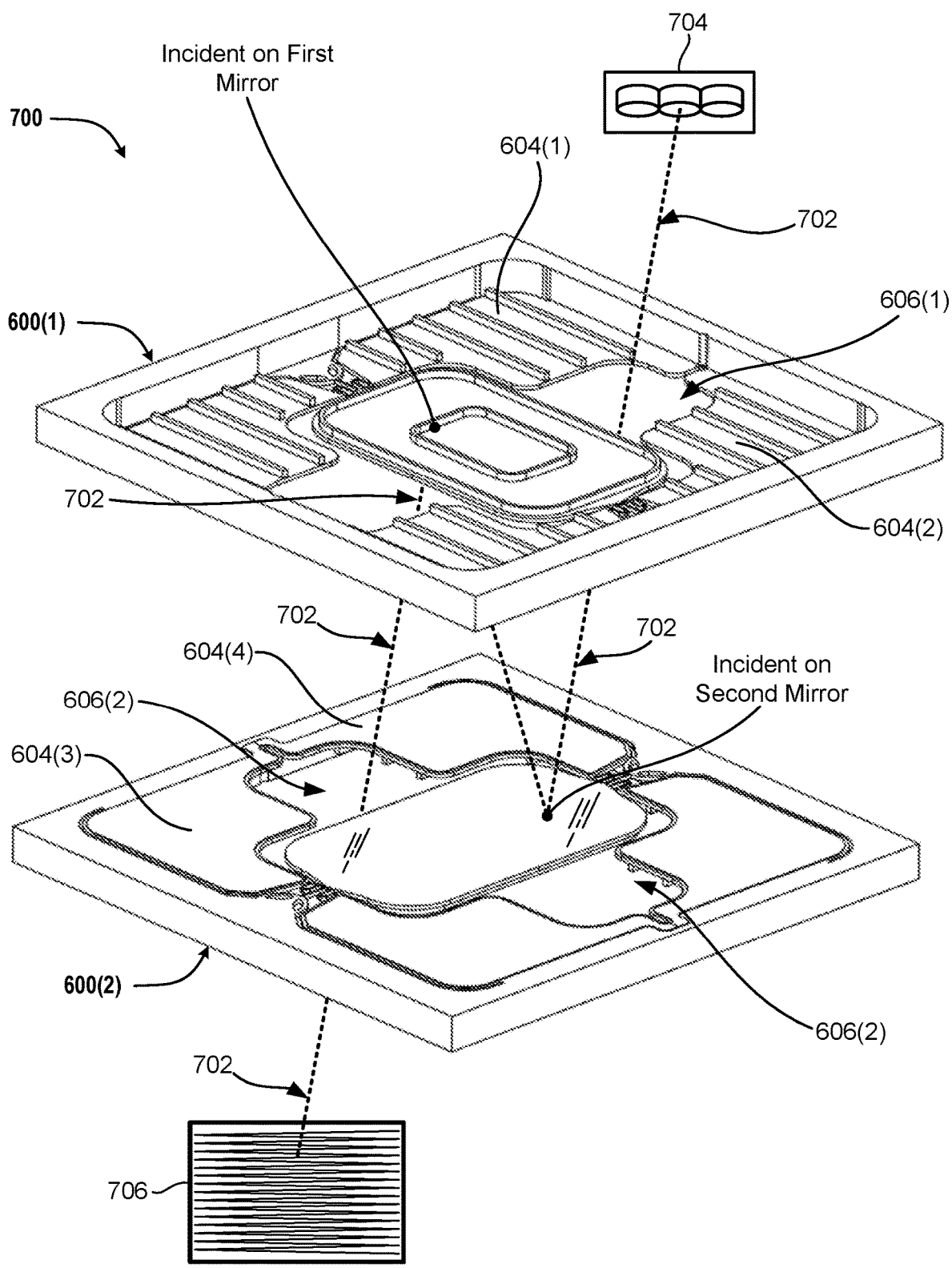
FIG. 7 illustrates an exemplary display system in which modulated light passes through one or more apertures that are formed between two actuators of a MEMS scanner.

Turning now to FIG. 7, illustrated is an exemplary display system 700 in which modulated light 702 passes through one or more apertures 606 of one or more MEMS scanners 600. As illustrated in FIG. 7, various portions of the path of the modulated light 702 are obscured by components of the MEMS scanners 600. It can be appreciated however the path is continuous and that portions of the path are merely illustrated as obstructed due to the viewing angle of the display system 700 and the opacity of the MEMS scanners 600.

Here, modulated light 702 is emitted from a light source 704 such as, for example, a light engine that includes multiple colored and/or infrared lasers. The modulated light 702 passes through a first aperture 606(1) that is adjacent to a first mirror 610(1) of a first MEMS scanner 600(1). As illustrated, the first aperture 606(1) is formed between a first actuator 604(1) and a second actuator 604(2) of the first MEMS scanner 600(1). After passing through the first aperture 606(1), the modulated light 702 falls incident on a second mirror 610(2) of a second MEMS scanner 600(2). As illustrated, the modulated light 702 is reflected off of the second mirror 610(2) onto a reflective surface of the first mirror 610(1) of the first MEMS scanner 600(1). The modulated light 702 is reflected off of the first mirror 610(1) and then passes through a second aperture 606(2) that is adjacent to the second mirror 610(2). As illustrated, the second aperture 606(2) is formed between a third actuator 604(3) and a fourth actuator 604(4) of the second MEMS scanner 600(2). Ultimately, after passing through one or more apertures 606 of one or more MEMS scanners 600, the modulated light 702 reaches a display component 706 in the form a controlled output beam such as a raster scanned beam.

Thus, it will be appreciated that the display system 700 may be a scanned beam display in which each of the mirrors 610 perform one of a horizontal scanning function or a vertical scanning function. For example, as illustrated, the first MEMS scanner 600(1) is oriented such that a rotational axis of the first mirror 610(1) is substantially orthogonal to a rotational axis of the second mirror 610(2). Thus, the first MEMS scanner 600(1) may scan the modulated light 702 in a first direction while the second MEMS scanner 600(2) scans the modulated light 702 in a second direction that is orthogonal to (or at least partially offset from) the first direction.

Figure 8:
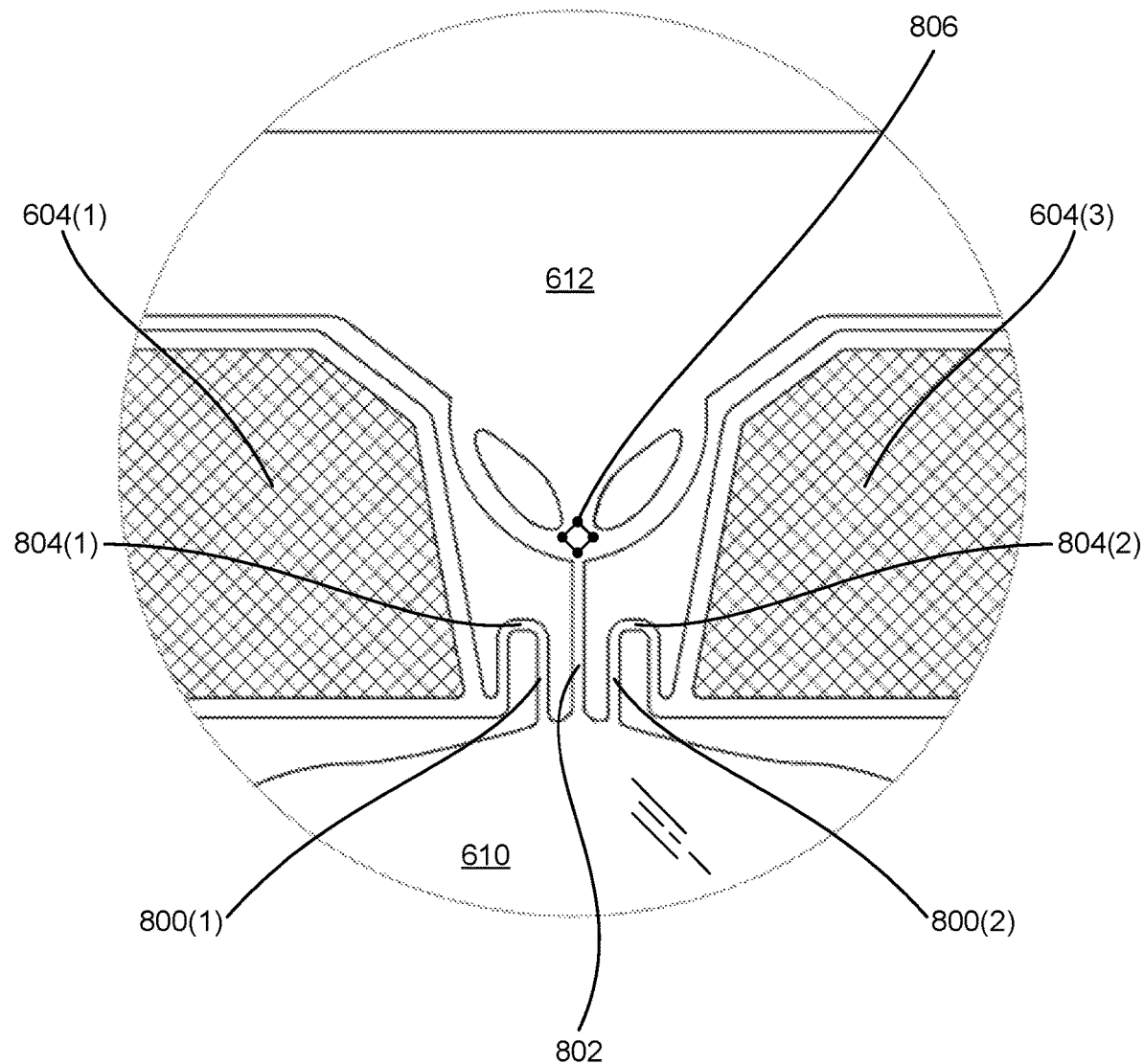
FIG. 8 illustrates addition details of the MEMS scanner in relation to Detail B of FIG. 6.

FIG. 8 illustrates addition details of the MEMS scanner 600 in relation to Detail B of FIG. 6. As shown in FIG. 8, in some embodiments, the individual actuators 604 of a MEMS scanner such as the MEMS scanner 600 (or any other MEMS scanner described herein) may be coupled to the scanning mirror 610 via lever arms 800 that connect directly to the scanning mirror 610 rather indirectly via a torsional beam flexure 802. As further illustrated in FIG. 8, each of a first lever arm 800(1) and a second lever arm 800(2) include a corresponding omega region 804, that extends at least partially longitudinal in relation to the rotational axis of the scanning mirror 610 for the purpose of providing mechanical compliance.

In some embodiments, the MEMS scanner 600 further includes a strain sensor 806 that is configured to measure an amount of mechanical strain within a portion of the torsional beam flexure 802 and/or the frame structure 612. This measured amount of mechanical strain may be used to provide a feedback signal to a controller that is providing drive signals to activate the actuators of the MEMS scanner 600. An exemplary strain sensor 806 may be a piezoresistive (PZR) strain sensor that is comprised of multiple PZR elements arranged in a bridge circuit arrangement (e.g., a Wheatstone bridge). The bridge circuit arrangement may include multiple PZR elements that are electrically coupled to one or more adjacent PZR elements via nodes. Individual ones of these nodes may be coupled to electrically conductive pathways (e.g., wire traces) that are embedded within and/or laid on top of the torsional beam flexure 802 and/or the frame structure 612.

An input signal (or bias voltage) VIN may be applied across one pair of the nodes to generate an output signal $V_{OUT}$ across another pair of the nodes. The output signal $V_{OUT}$ varies in proportion to the mechanical strain (including the torsional deformation) applied to the bridge circuit arrangement. Thus, the feedback signal is indicative of the true angular position of the scanning mirror. The controller may use the feedback signal for continually correcting the drive signals so as to improve the accuracy with which the angular position of the scanning mirror is modulated.

Figure 9:
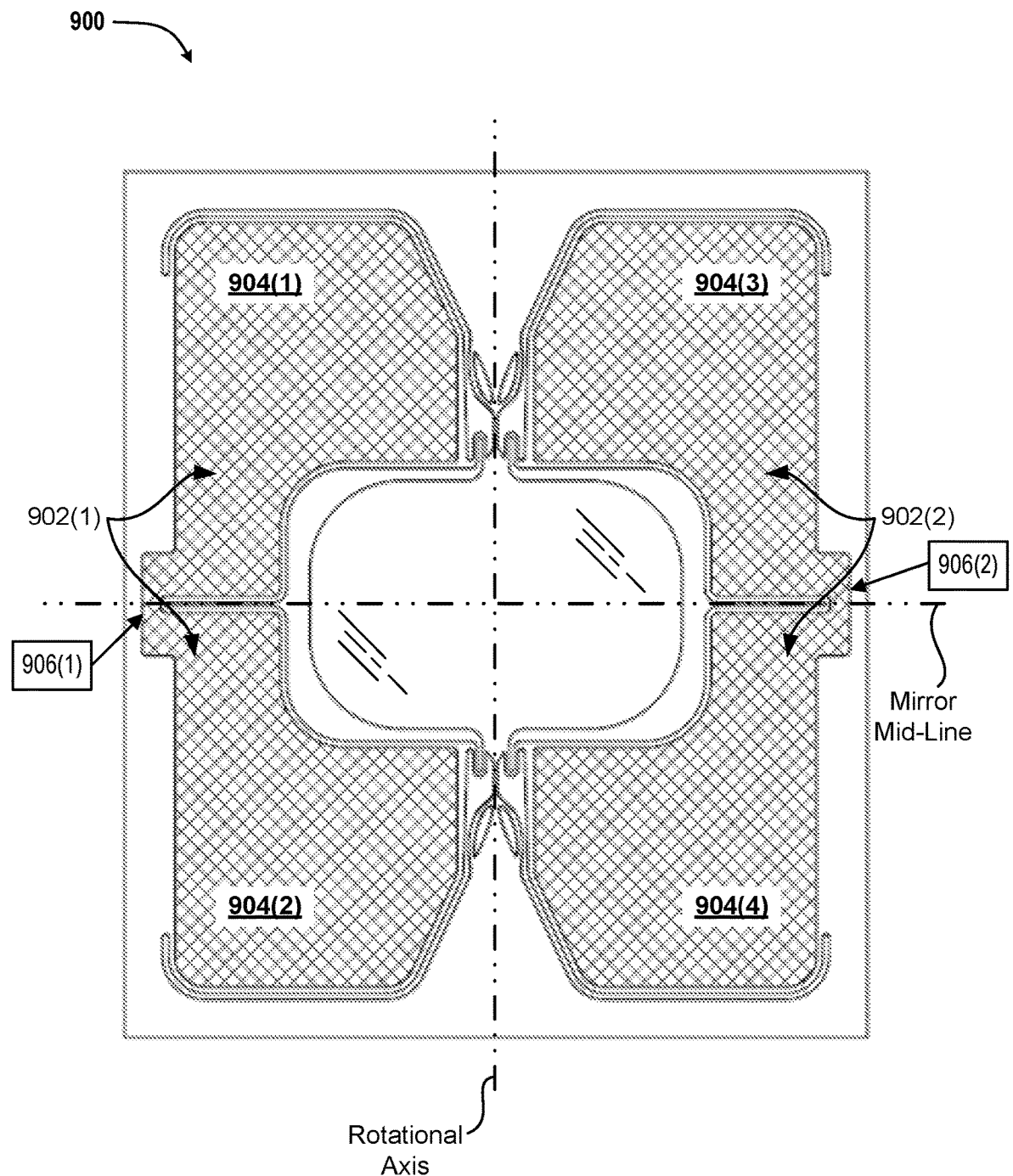
FIG. 9 illustrates an alternate embodiment of an exemplary MEMS scanner that includes two actuator pairs that each include two individual actuators over which a continuous thin-film area is deposited.

Turning now to FIG. 9, illustrated is an alternate embodiment of an exemplary MEMS scanner 900 that includes two actuator pairs 902 that each include two individual actuators 904 over which a continuous thin-film area is deposited. As illustrated, a first thin-film area is represented by a first region of continuous diamond hatching that extends from a first actuator 904(1) to a second actuator 904(2) that together form a first actuator pair 902(1). Similarly, a second thin-film area is represented by a second region of continuous diamond hatching that extends from a third actuator 904(3) to a fourth actuator 904(4) that together form a second actuator pair 902(2).

Since each of the first thin-film area and second thin-film areas are continuous, each of the first actuator pair 902(1) and the second actuator pair 902(2) can be activated via a single respective drive signal 906. For example, as illustrated, a first drive signal 906(1) may be applied to the first thin-film area which continuously extends between the first actuator 904(1) and the second actuator 904(2) to cause each of the first actuator 904(1) and the second actuator 904(2) to deform in unison. Similarly, a second drive signal 906(2) may be applied to the second thin-film area which continuously extends between the third actuator 904(3) and the fourth actuator 904(4) to cause each of the third actuator 904(3) and the fourth actuator 904(4) to deform in unison.

Figure 10:
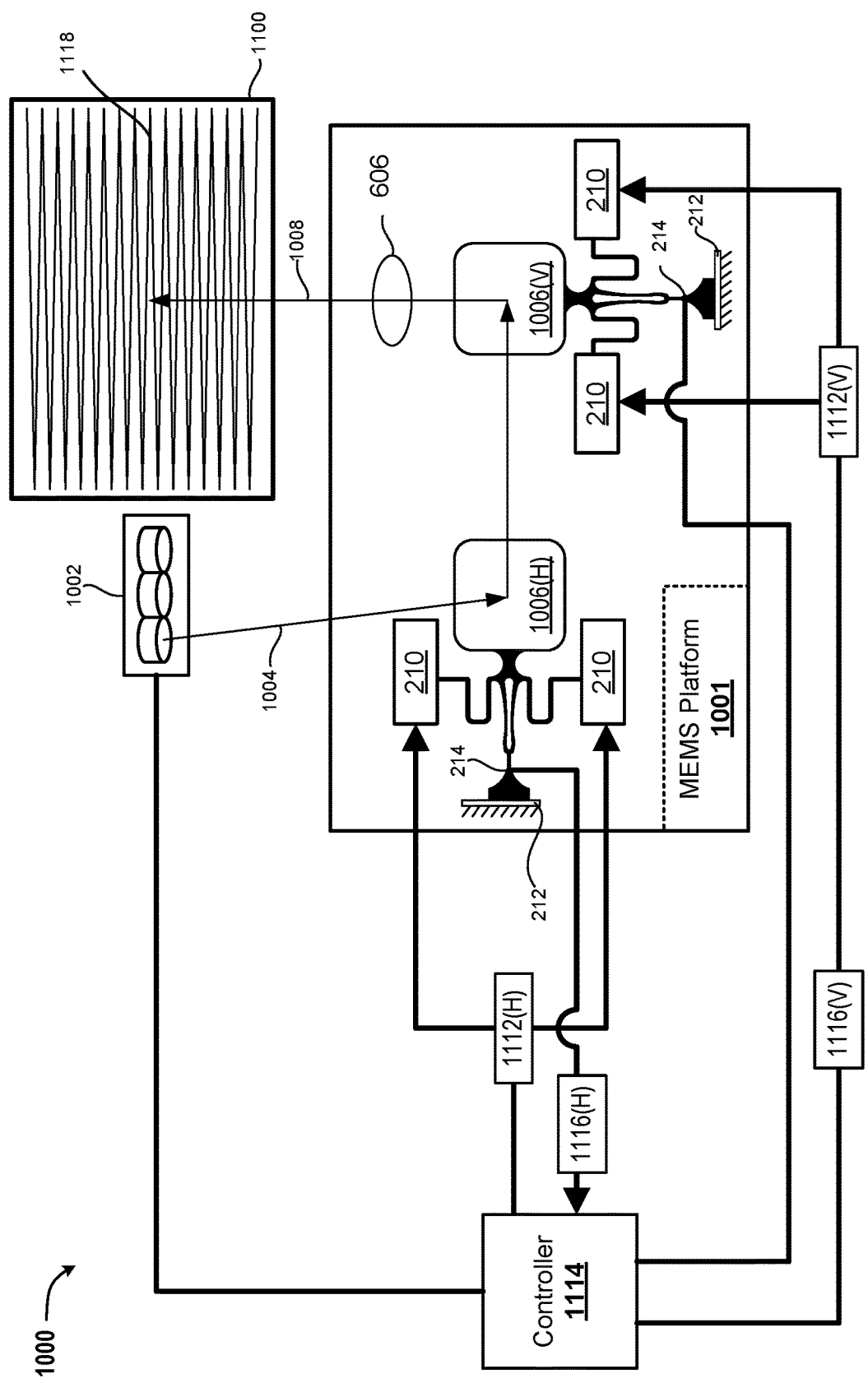
FIG. 10 illustrates an exemplary scanned beam display system in which various embodiments of the MEMS scanners described herein may be deployed.

Turning now to FIG. 10, illustrated is an exemplary scanned beam display system 1000 in which various embodiments of the MEMS scanners described herein may be deployed. As illustrated, the scanned beam display system 1000 may comprises a light engine 1002 which may include one or more light sources capable of emitting one or more beams 1004 of light toward one or more scanning mirrors 1006. In some embodiments, the light engine 1002 includes multiple laser light sources that are individually capable of emitting light of a particular wavelength and/or within a particular range of wavelengths. As illustrated, the beam(s) 1004 of light are incident on a MEMS platform 1001 and reflects on the one or more scanning mirrors 1006. In the specifically illustrated but nonlimiting scenario, the MEMS platform 1001 includes a horizontal scanning mirror 1006(H) and a vertical scanning mirror 1006(V). As illustrated, the beam(s) 1004 are initially incident on the horizonal scanning mirror 1006(H) and then the vertical scanning mirror 1006(V) and then are ultimately output from the MEMS platform 1001 as a controlled output beam 1008 that is directed toward a display 1100. In one or more alternative embodiments, the beam(s) 1004 may initially be incident on the vertical scanning mirror 1006(V), then reflected to the horizontal scanning mirror 1006(H), and finally toward the display 1100 in the form of the controlled output beam 1008. In one or more alternate embodiments, a single scanning mirror 1006 may scan the beam(s) 1004 in both the horizonal and vertical directions. As described above in relation to FIG. 7, in various embodiments, one or both of the beam 1004 or the controlled output beam 1008 may pass through one of more apertures 606 of a MEMS scanner such as, for example, the MEMS scanner 600.

In the illustrated embodiment, a horizontal drive signal 1112(H) drives one or more actuators 210 whereas a vertical drive signal 1112(V) drives one or more actuators 210, which may be different than those actuators 210 driven by the horizontal drive signal 1112(H). Thus, by suppling the horizonal drive signal 1112(H) and the vertical drive signal 1112(V), the controller 1114 causes the MEMS platform 1001 to deflect the scanning mirror(s) 1006 to cause output beam 1008 to generate a biaxial scan 1118, thereby creating a displayed image via the display 1100. For example, the controller 1114 may convert pixel information of an input image into laser modulation synchronous to the motion of MEMS platform 1001 to write the image information as a displayed image based upon the position of the output beam 1008 in a raster pattern and the corresponding intensity and/or color information at the corresponding pixel in the image.

Controller 1114 may also control other various functions of scanned beam display system 1000. In one or more embodiments, a horizontal axis may refer to the horizontal direction of biaxial scan 1118 and the vertical axis may refer to the vertical direction of biaxial scan 1118. Scanning mirror(s) 1006 may sweep the output beam 1008 horizontally at a relatively higher frequency and also vertically at a relatively lower frequency and with a constant velocity over a portion of the scan. The result is a scanned trajectory of output beam 1008 to result in biaxial scan 1118. The fast and slow axes may also be interchanged such that the fast scan is in the vertical direction and the slow scan is in the horizontal direction. However, the scope of the claimed subject matter is not limited in these respects.

As illustrated, the same controller 1114 that provides the drive signals 1112 to one or more actuators 210 of the MEMS platform 1001 may receive feedback signals 1116 on a continuously and/or periodic basis. The feedback signals 1116 may be provided by a strain sensor such as, for example, the strain sensor 806. As discussed further herein, an exemplary strain sensor may comprise a piezoresistive (PZR) sensor that transduces mechanical movement of a specific portion of the MEMS platform 1001 into an electrical signal to generate the feedback signal 1116.

In some embodiments, the scanned beam display system 1000 may be a component of a Near-Eye-Display device for implementing augmented reality (AR) technologies to generate composite views that include computer-generated images superimposed over a real-world view. In such embodiments, the display 1100 may be a transparent display panel such as, for example, a waveguide display that includes one or more diffractive optical elements (DOEs) for in-coupling incident light into the waveguide, expanding the incident light in one or more directions for exit pupil expansion, and/or out-coupling the incident light out of the waveguide (e.g., toward a user's eye).

In the foregoing Summary and/or Detailed Description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail. Furthermore, the terms coupled and/or connected, along with their derivatives, may be used throughout this disclosure. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. One or more of "on," "overlying," and "over" may be used to indicate that two or more elements are in direct physical contact with each other. However, "on," "overlying," and/or "over" may also describe a locational relationship between two or more elements that are not in direct contact with each other. For example, "over" may mean that one element is above another element but not necessarily in direct contact with that other element (e.g., another element or elements may be in between the two elements).

EXAMPLE CLAUSES

Example Clause 1. A microelectromechanical systems (MEMS) scanning device, comprising: a scanning mirror that includes: a first end and a second end that is opposite the first end, and a first side and a second side that is opposite the first side; a first torsional beam flexure mechanically suspending the first end of the scanning mirror from a frame structure; a second torsional beam flexure mechanically suspending the second end of the scanning mirror from the frame structure; a first actuator pair disposed at least partially adjacent to the first side of the scanning mirror; and a second actuator pair disposed at least partially adjacent to the second side of the scanning mirror.

Example Clause 2. The microelectromechanical systems (MEMS) scanning device of Example Clause 1, wherein: the first actuator pair includes: a first actuator extending between the frame structure and the first torsional beam flexure, and a second actuator arm extending between the frame structure and the second torsional beam flexure; and the second actuator pair includes: a third actuator extending between the frame structure and the first torsional beam flexure, and a fourth actuator extending between the frame structure and the second torsional beam flexure.

Example Clause 3. The microelectromechanical systems (MEMS) scanning device of Example Clause 1, further comprising: a first piezoelectric film that continuously extends across the first actuator pair; and a second piezoelectric film that continuously extends across the second actuator pair.

Example Clause 4. The microelectromechanical systems (MEMS) scanning device of Example Clause 1, wherein the frame structure includes: a first actuator support protruding toward the first side of the scanning mirror, and a second actuator support protruding toward the second side of the scanning mirror.

Example Clause 5. The microelectromechanical systems (MEMS) scanning device of Example Clause 4, wherein: the first actuator extends from the first actuator support in a first direction, the second actuator extends from the first actuator support in a second direction, the third actuator extends from the second actuator support in the first direction, and the fourth actuator extends from the second actuator support in the second direction.

Example Clause 6. The microelectromechanical systems (MEMS) scanning device of Example Clause 1, wherein individual actuators within the first actuator pair and the second actuator pair have individual arm midlines that extend away from a mirror mid-line, of the scanning mirror, and towards the first end or the second end of the scanning mirror.

Example Clause 7. The microelectromechanical systems (MEMS) scanning device of Example Clause 1, further comprising an aperture formed between a first actuator of the first actuator pair and a second actuator of the first actuator pair.

Example Clause 8. The microelectromechanical systems (MEMS) scanning device of Example Clause 1, wherein individual actuators within the first actuator pair are coupled to the first end of the scanning mirror via the first torsional beam flexure, and wherein other individual actuators within the second actuator pair are coupled to the second end of the scanning mirror via the second torsional beam flexure.

Example Clause 9. The microelectromechanical systems (MEMS) scanning device of Example Clause 1, wherein the first actuator pair, that is disposed at least partially adjacent to the first side of the scanning mirror, extends at least partially beyond the first end and the second end of the scanning mirror, and wherein the second actuator pair, that is disposed at least partially adjacent to the second side of the scanning mirror, extends at least partially beyond the first end and the second end of the scanning mirror.

Example Clause 10. An apparatus, comprising: a scanning mirror; at least one torsional beam flexure mechanically suspending at least one end of the scanning mirror from a frame structure; at least one actuator disposed at least partially adjacent to at least one side of the scanning mirror; and a controller configured to provide drive signals to the at least one actuator, wherein the drive signals cause the at least one actuator to deform to induce rotation of the scanning mirror about a rotational axis.

Example Clause 11. The apparatus of Example Clause 10, wherein at least one portion of the at least one actuator extends from the at least one side of the scanning mirror beyond at least one end of the scanning mirror.

Example Clause 12. The apparatus of Example Clause 11, wherein the at least one portion that extends beyond at least one end of the scanning mirror includes at least one actuator tip that is mechanically coupled to the at least one torsional beam flexure by way of at least one lever arm.

Example Clause 13. The apparatus of Example Clause 10, wherein individual actuators of the at least one actuator have individual arm midlines that extend away from a mirror mid-line of the scanning mirror.

Example Clause 14. The apparatus of Example Clause 10, wherein the at least one actuator includes a thin-film piezoelectric actuator.

Example Clause 15. The apparatus of Example Clause 10, wherein the at least one actuator includes a first actuator and a second actuator disposed adjacent to single side of the scanning mirror.

Example Clause 16. The apparatus of Example Clause 15, further comprising a piezoelectric film that continuously extends across the first actuator and the second actuator.

Example Clause 17. The apparatus of Example Clause 15, further comprising: an aperture formed between the first actuator the second actuator, and a light source configured to emit light through the aperture.

Example Clause 18. A microelectromechanical systems (MEMS) scanning device, comprising: a scanning mirror that includes: a first end and a second end that is opposite the first end, and a first side and a second side that is opposite the first side; a frame structure that encompasses the scanning mirror, wherein the frame structure includes: a first actuator support disposed adjacent to the first side of the scanning mirror, and a second actuator support disposed adjacent to the second side of the scanning mirror; a first torsional beam flexure mechanically suspending the first end of the scanning mirror from the frame structure; a second torsional beam flexure mechanically suspending the second end of the scanning mirror from the frame structure; a first actuator pair cantilevered from the first actuator support, the first actuator pair including: a first actuator arm extending between the first actuator support and the first torsional beam flexure, and a second actuator arm extending between the first actuator support and the second torsional beam flexure; and a second actuator pair cantilevered from the second actuator support, the second actuator pair including: a third actuator arm extending between the second actuator support and the first torsional beam flexure, and a fourth actuator arm extending between the second actuator support and the second torsional beam flexure.

Example Clause 19. The microelectromechanical systems (MEMS) scanning device of Example Clause 18, further comprising: an aperture formed between the first actuator the second actuator, and a light source configured to emit light through the aperture.

Example Clause 20. The microelectromechanical systems (MEMS) scanning device of Example Clause 18, wherein individual actuators within the first actuator pair and the second actuator pair have individual arm midlines that extend away from a mirror mid-line of the scanning mirror.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A microelectromechanical systems (MEMS) scanning device, comprising:
   a scanning mirror that includes:
      a first end and a second end that is opposite the first end; and
      a first side and a second side that is opposite the first side;
   a first torsional beam flexure mechanically suspending the first end of the scanning mirror from a frame structure;
   a second torsional beam flexure mechanically suspending the second end of the scanning mirror from the frame structure;
   a first actuator pair disposed at least partially adjacent to the first side of the scanning mirror; and
   a second actuator pair disposed at least partially adjacent to the second side of the scanning mirror.

2. The microelectromechanical systems (MEMS) scanning device of claim 1, wherein:
   the first actuator pair includes:
      a first actuator extending between the frame structure and the first torsional beam flexure; and
      a second actuator arm extending between the frame structure and the second torsional beam flexure; and
   the second actuator pair includes:
      a third actuator extending between the frame structure and the first torsional beam flexure; and
      a fourth actuator extending between the frame structure and the second torsional beam flexure.

3. The microelectromechanical systems (MEMS) scanning device of claim 1, further comprising:
   a first piezoelectric film that continuously extends across the first actuator pair; and
   a second piezoelectric film that continuously extends across the second actuator pair.

4. The microelectromechanical systems (MEMS) scanning device of claim 1, wherein the frame structure includes:
   a first actuator support protruding toward the first side of the scanning mirror; and
   a second actuator support protruding toward the second side of the scanning mirror.

5. The microelectromechanical systems (MEMS) scanning device of claim 4, wherein:
   the first actuator extends from the first actuator support in a first direction;
   the second actuator extends from the first actuator support in a second direction;
   the third actuator extends from the second actuator support in the first direction; and
   the fourth actuator extends from the second actuator support in the second direction.

6. The microelectromechanical systems (MEMS) scanning device of claim 1, wherein individual actuators within the first actuator pair and the second actuator pair have individual arm midlines that extend away from a mirror mid-line, of the scanning mirror, and towards the first end or the second end of the scanning mirror.

7. The microelectromechanical systems (MEMS) scanning device of claim 1, further comprising an aperture formed between a first actuator of the first actuator pair and a second actuator of the first actuator pair.

8. The microelectromechanical systems (MEMS) scanning device of claim 1, wherein individual actuators within the first actuator pair are coupled to the first end of the scanning mirror via the first torsional beam flexure, and wherein other individual actuators within the second actuator pair are coupled to the second end of the scanning mirror via the second torsional beam flexure.

9. The microelectromechanical systems (MEMS) scanning device of claim 1, wherein the first actuator pair, that is disposed at least partially adjacent to the first side of the scanning mirror, extends at least partially beyond the first end and the second end of the scanning mirror, and wherein the second actuator pair, that is disposed at least partially adjacent to the second side of the scanning mirror, extends at least partially beyond the first end and the second end of the scanning mirror.

10. An apparatus, comprising:
    a scanning mirror;
    at least one torsional beam flexure mechanically suspending at least one end of the scanning mirror from a frame structure;
    a first actuator and a second actuator disposed adjacent to a single side of the scanning mirror;
    a controller configured to provide drive signals to the first actuator and the second actuator, wherein the drive signals cause the first actuator and the second actuator to deform to induce rotation of the scanning mirror about a rotational axis;
    an aperture formed between the first actuator the second actuator; and
    a light source configured to emit light through the aperture.

11. The apparatus of claim 10, wherein at least one portion of at least one of the first actuator or the second actuator extends from the single side of the scanning mirror beyond at least one end of the scanning mirror.

12. The apparatus of claim 11, wherein the at least one portion that extends beyond the at least one end of the scanning mirror includes at least one actuator tip that is mechanically coupled to the at least one torsional beam flexure by way of at least one lever arm.

13. The apparatus of claim 10, wherein at least one of the first actuator or the second actuator has individual arm midlines that extend away from a mirror mid-line of the scanning mirror.

14. The apparatus of claim 10, wherein at least one of the first actuator or the second actuator includes a thin-film piezoelectric actuator.

15. The apparatus of claim 10, further comprising a piezoelectric film that continuously extends across the first actuator and the second actuator.

16. A microelectromechanical systems (MEMS) scanning device, comprising:
    a scanning mirror that includes:
       a first end and a second end that is opposite the first end; and a first side and a second side that is opposite the first side;
a frame structure that encompasses the scanning mirror, wherein the frame structure includes:
    a first actuator support disposed adjacent to the first side of the scanning mirror; and
    a second actuator support disposed adjacent to the second side of the scanning mirror;
a first torsional beam flexure mechanically suspending the first end of the scanning mirror from the frame structure;
a second torsional beam flexure mechanically suspending the second end of the scanning mirror from the frame structure;
a first actuator pair cantilevered from the first actuator support, the first actuator pair including:
    a first actuator arm extending between the first actuator support and the first torsional beam flexure; and
    a second actuator arm extending between the first actuator support and the second torsional beam flexure; and
a second actuator pair cantilevered from the second actuator support, the second actuator pair including:
    a third actuator arm extending between the second actuator support and the first torsional beam flexure; and
    a fourth actuator arm extending between the second actuator support and the second torsional beam flexure.

17. The microelectromechanical systems (MEMS) scanning device of claim 16, further comprising:
    an aperture formed between the first actuator the second actuator; and
    a light source configured to emit light through the aperture.

18. The microelectromechanical systems (MEMS) scanning device of claim 16, wherein individual actuators within the first actuator pair and the second actuator pair have individual arm midlines that extend away from a mirror mid-line of the scanning mirror.

* * * * *